United States Patent [19]

Sakauchi et al.

[11] 4,008,437
[45] Feb. 15, 1977

[54] AUTOMATIC TUNING APPARATUS

[75] Inventors: Yoshiaki Sakauchi, Tenri; Kazufumi Ushijima, Hirakati; Hajime Suzuki, Higashiosaka; Shigeru Wakamoto, Daito, all of Japan

[73] Assignee: Sanyo Electric Co., Ltd., Moriguchi, Japan

[22] Filed: Aug. 4, 1975

[21] Appl. No.: 601,283

[30] Foreign Application Priority Data

Dec. 17, 1974 Japan ............................ 49-147047

[52] U.S. Cl. .................. 325/422; 325/470
[51] Int. Cl.$^2$ ............................... H04B 1/34
[58] Field of Search ......... 325/320, 321, 322, 323, 325/452, 464, 465, 469, 470, 492; 331/177 V; 332/29 R, 30 V; 334/15

[56] References Cited

UNITED STATES PATENTS

| | | | |
|---|---|---|---|
| 3,798,553 | 3/1974 | Sakamoto | 325/421 X |
| 3,806,817 | 4/1974 | Uchida | 325/464 X |
| 3,864,636 | 2/1975 | Fukuda et al. | 325/470 X |

*Primary Examiner*—Benedict V. Safourek
*Attorney, Agent, or Firm*—Darby & Darby

[57] ABSTRACT

An automatic tuning apparatus comprising a tuner having a tank circuit employing a voltage controlled variable capacitance diode as a circuit element, which diode is reverse biased with a scanning control voltage from a solid state potential memory device, which control voltage is varied under the control of a scanning voltage control circuit to scan the frequencies in the frequency band by the tuner and is set by a scan stop signal obtained from the tuner as a result of tuning of the tuner to a certain frequency, said scan stop signal being withdrawn by way of a logical product of the level detected output of the IF signal and the level detected output of the ratio detected output of the IF signal, a manual switch for starting the scanning, an automatic frequency control responsive to said level detected output of said ratio detected output for charging or discharging said potential memory device, said automatic frequency control being disabled in response to the absence of the level detected output of the IF signal, and a pseudo IF signal generating circuit responsive to turning on of the power source for providing a pseudo IF signal for a predetermined period of time, whereby the automatic frequency control is performed irrespective of a possible change in the IF signal after the power source is turned off until it is turned on again.

7 Claims, 5 Drawing Figures

FIG. 5

AUTOMATIC TUNING APPARATUS

BACKGROUND OF THE INVENTION

1. Field of the Invention

The present invention relates to an automatic tuning apparatus. More specifically, the present invention relates to an improved automatic tuning apparatus employing a voltage controlled variable reactance device.

2. Description of the Prior Art

Recently an automatic tuning apparatus employing a voltage controlled variable capacitor has been widely used in radio receivers, television receivers and the like. Such a voltage controlled variable capacitor uses a capacitance formed at a barrier portion of a diode, variable as a function of a reverse voltage applied thereacross and is known as a variable capacitance diode. In such an automatic tuning apparatus, it is necessary to provide a voltage supply capable of providing a voltage variable as chosen in response to manual operation, which causes a capacitance with which the tuning apparatus selects a desired tuning frequency and thus selects a desired transmitting station. It is well known that such a voltage is closely related with the tuning frequency and thus the selected transmitting station.

One type of such a voltage supply for providing a voltage variable in response to manual operation to a variable capacitance diode comprises a capacitor and a charging/discharging control circuit therefor, a voltage across the capacitor, as selected in response to a tuning output, being applied to the variable capacitance diode. More specifically, the capacitor is charged or discharged by the charging/discharging control circuit in response to manual operation until a voltage across the capacitor causes capacitance in the diode with which the tuning circuit tunes to a given frequency to provide a tuning output therefrom when the charging/discharging control circuit is disabled to discontinue to charge or discharge the capacitor, so that the voltage thus provided across the capacitor remains the same. If another tuning frequency is desired, the charging/discharging control circuit is again enabled through manual operation and the abovementioned operation is repeated until another channel is selected.

A disadvantage encountered in the automatic tuning apparatus with a voltage controlled variable capacitance diode supplied with a control voltage from a capacitor is that the voltage across the capacitor gradually becomes lower because of leakage through an undesired leakage path, which causes detuning of the selecting apparatus and thus results in a poor quality of sound by the speaker of the radio receiver. In order to solve such a problem it is required to provide a circuit for compensating the decrease in voltage across the capacitor because of leakage, which makes the circuit complicated and the system expensive. Another disadvantage in the automatic tuning apparatus using a variable capacitance diode supplied with a voltage across the capacitor is that the voltage across the capacitor is charged or discharged in an exponential manner rather than in a linear manner, which makes it difficult to achieve precise automatic tuning. It is desired that an improved voltage supply source for providing a variable voltage to a variable capacitance diode is provided, which is suited for employment in an automatic tuning apparatus.

A voltage storing device of interest in connection with the present invention is disclosed in U.S. Pat. No. 3,753,110 issued Aug. 14, 1973 to Hironosuke Ikeda et al, and assigned to Sanyo Electric Co., Ltd, the same assignee as that of the present invention. As set forth in the referenced patent, Professor Takehiko Takahashi and Assistant Professor Osamu Yamamoto, Technological Department of Nagoya University, announced their study on the electrochemical potential memory device by the use of a solid state electrolyte at the 22nd annual assembly of Japan Chemical Association held on Apr. 5th to 7th, 1969. Briefly stated, this device comprises an Ag electrode as a cathode, an Ag-Te alloy electrode as an anode, and a solid state electrolyte having high ion conductivity, such as $RbAg_4I_5$ sandwiched between both electrodes. When a DC voltages is applied to the device so that the Ag electrode may be negative, a portion of Ag contained in the Ag-Te alloy electrode migrates over to the Ag electrode, resulting in decreased activity of Ag in the Ag-Te alloy, and thus an increased potential difference between both electrodes. The inventors of this device termed this state of operation as "charging". When the polarity of the applied DC voltage is reversed to that of the former case, Ag is refilled into the Ag-Te alloy, resulting in the decreased potential difference and returns to the initial value eventually. The inventors of this device termed this state of operating as "discharging". Study disclosed by the inventors of this device indicates that the electromotive force generated by the abovementioned charging or discharging current can cause a linear change to some extent with respect to the charging or discharging time. Thus this device makes it possible to effect write-in and non-destructive read-out operation while preserving relatively linear relation between the charging or discharging time and terminal voltage, and in addition, it can hold the memory condition for a relatively longer period of time. The referenced patent further discloses an improved electrochemical potential memory device. More specifically, FIG. 6 of the referenced patent shows an improved electrochemical potential memory device for eliminating the IR drop across the resistance in the electrolyte and the overvoltage caused by dissolution or deposition of Ag, which is basically characterized by the provision of an auxiliary cathode that comprises an output terminal for detecting the potential separately from the abovementioned cathode available for the input terminal for the current conduction. In view of these advantageous characteristics of the abovementioned memory device, it is possible to utilize this device as a voltage source for providing a voltage variable in response to manual operation to a voltage controlled variable reactance device employed in an automatic tuning apparatus.

As described previously, a typical prior art automatic tuning apparatus comprises a capacitor connected to provide a terminal voltage thereof to a voltage controlled variable capacitance diode coupled associated with a tuning circuit of the automatic tuning apparatus, and a charging/discharging control circuit operable in response to manual operation for enabling the control circuit for charging or discharging the capacitor and in response to an output of said tuning circuit for disabling the control circuit to discontinue to charge or discharge the capacitor, so that the voltage thus provided across the capacitor is applied to the variable capacitance diode to cause a desired capacitance in the diode with which the tuning circuit is tuned to a desired frequency to provide a tuning output therefrom, which tuning output is applied to the charging/discharging control circuit, as described above. In such an automatic tuning apparatus, now consider a case where a power supply is turned off after a given broadcast is once received as a result of tuning thereto and the power supply is turned on again thereafter. In such a situation it is desired that the same broadcast wave received before the power supply was turned off is received again even after the power supply is turned on. Nevertheless, any charge stored in the capacitor is discharged after the power supply is turned off, resulting in a change in the terminal voltage of the capacitor. Thus, the same broadcast wave as received before is not necessarily received when the power supply is turned on again.

The above described inconvenience by adoption of a capacitor as a voltage source for providing a varying voltage can be solved to some extent by adoption of the above described solid state potential memory device, inasmuch as the above described potential memory device has a characteristic being capable of holding the terminal voltage thereof for so many hours. However, detuning could happen because of a drift in the above described potential memory device, a direct current amplifier for amplifying the terminal voltage of the device, the tuner, etc. caused by variation of the ambient temperature and fluctuation of the voltage source. Such detuning could be solved by provision of an automatic frequency control. Nevertheless, adoption of the automatic frequency control in the automatic tuning apparatus can not solve any inconveniencies described previously which are encountered when the power supply is turned on again after the tuner is tuned to a given broadcast wave and the power supply is turned off.

SUMMARY OF THE INVENTION

Briefly stated, the present invention comprises an automatic tuning apparatus comprising; tuning means comprising a voltage controlled variable reactance device, means for supplying a control voltage to said voltage controlled variable reactance device, said control voltage determining a reactance value of said voltage controlled variable reactance device and thus determining a tuning frequency of said tuning means, means for changing said control voltage supplied from said control voltage supplying means to said voltage controlled variable reactance device for causing a change in reactance of said voltage controlled reactance device and thus a change in a tuning frequency of said tuning means, manually operable means for instructing said change in a tuning frequency of said tuning means, means for level detecting the amplitude of the output from said tuning means, means for providing a signal associated with the frequency of the output from said tuning means, means responsive to simultaneous outputs of said amplitude level detecting means and said frequency associated signal providing means for providing a logical product of said amplitude level detected signal and said frequency associated signal, means responsive to the instructing signal of said manually operable means and responsive to said logical product signal for enabling said means for changing said control voltage supplied from said control voltage supplying means, and means responsive to said frequency associated signal of said frequency associated signal providing means for changing said control voltage supplied from said control voltage supplying means for compensating deviation of the tuning frequency, characterized in that said apparatus further comprises means responsive to absence of said amplitude level detected signal of said amplitude level detecting means for disabling said frequency compensating means, and means responsive to turning on of a power supply for providing for a predetermined period of time a pseudo amplitude level detected signal for forcibly enabling said frequency compensating means for said predetermined period of time, whereby an automatic frequency control is performed immediately after the turning of the power supply irrespective of a possible change in the amplitude of the output from the said tuning means after the power source is turned off until it is turned on again.

Therefore, it is a principal object of the present invention to provide an improved automatic tuning apparatus using a voltage controlled variable reactance device and employing an automatic frequency control.

It is another object of the present invention to provide an improved automatic tuning apparatus using a voltage controlled variable reactance device and employing an automatic frequency control in which an inconvenience encountered in connection with turning on and off of the power supply is solved.

According to an aspect of the present invention, an automatic tuning apparatus is provided which enables reception of the same broadcast wave as received before a power supply is turned off even after power supply is turned on again.

According to another aspect of the present invention, an automatic tuning apparatus is provided which enables reception of the same broadcast wave as received irrespective of a drift in the circuit components in the apparatus caused by variation of the ambient temperature, fluctuation of the voltage source, and the like.

These objects and other objects and features of the present invention will be better understood when taken in conjunction with the following detailed description made with reference to the accompanying drawings.

DESCRIPTION OF THE PREFERRED EMBODIMENTS

Figure 1:
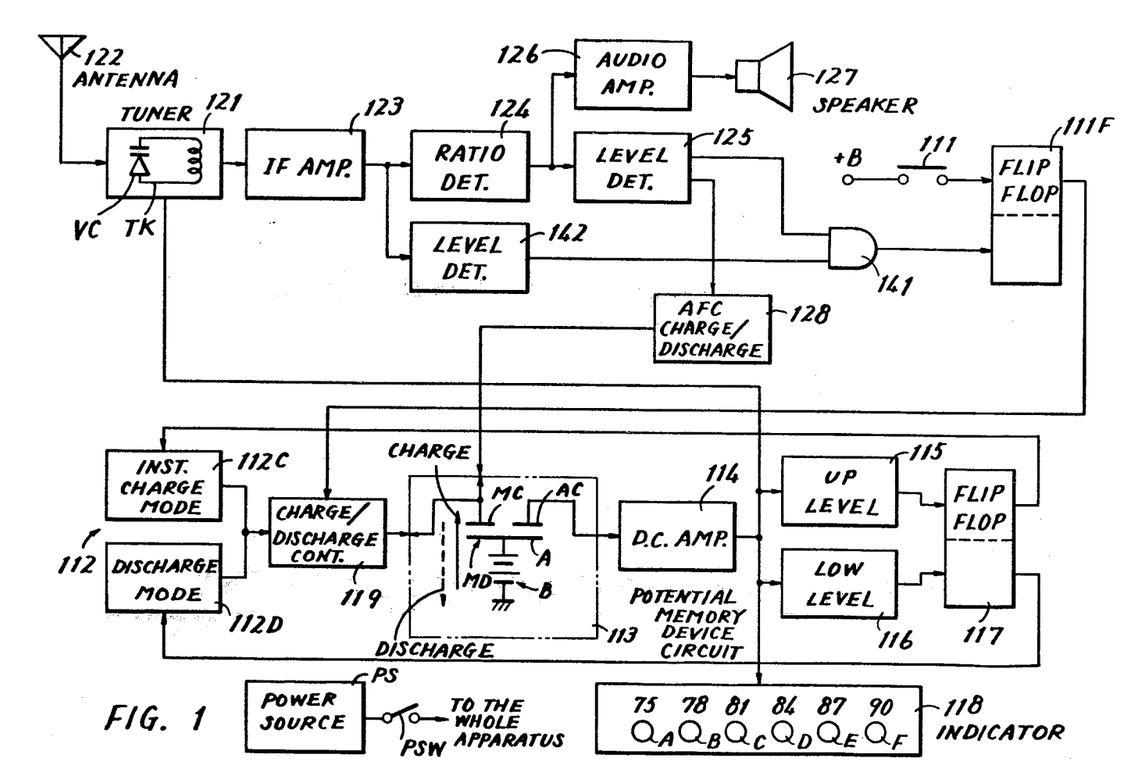
FIG. 1 is a block diagram of an FM radio receiver employing an automatic tuning apparatus in which the present invention can be advantageously employed.

FIG. 1 illustrates a block diagram of an FM radio receiver employing an automatic tuning apparatus having a tuning or tank circuit employing a voltage controlled variable capacitance diode which is supplied with a scanning control voltage from a voltage source using the abovementioned potential memory device, in which the present invention can be advantageously embodied as to be more fully described subsequently. A major portion of a typical radio receiver is shown in the upper half portion of the FIG. 1 diagram, which comprises an antenna 122, a tuner 121, an intermediate frequency amplifier 123, a ratio detector 124 coupled to the intermediate frequency amplifier 123 for detecting the frequency of the intermediate frequency output and subsequent audio stages, such as an audio amplifier 126 and a speaker 127, which are well known and therefore not described in detail. The tuner 121 usually comprises a high frequency amplifier, a local oscillator and a mixer. For the purpose of embodying the present invention, the tuner 121 of the radio receiver shown further comprises a voltage controlled variable reactance device VC, which is connected so as to constitute a part of a tuning circuit TK for the high frequency amplifier and the local oscillator. A typical and preferred voltage controlled variable reactance device of a solid state type now commercially available is a voltage controlled variable capacitor. As described in the foregoing, such a voltage controlled variable capacitor uses a capacitance formed at a barrier portion of a semiconductor diode, which is variable as a function of or in reverse proportion to a reverse voltage applied thereacross, and is also known as a variable capacitance diode. However, it should be understood that any type of a voltage controlled variable reactance device can be used for the purpose of the present invention, so far as it is available.

FIG. 1 also shows in the lower half portion thereof an embodiment of an automatic tuning apparatus incorporated in the abovementioned radio receiver. Briefly stated, the automatic tuning apparatus shown is enabled to start automatic tuning operation by manual operation of a switch, which causes the abovementioned potential memory device to be discharged or charged and thus the increased or decreased voltage thereacross to be applied to the voltage controlled variable capacitance diode connected associated with tuning circuits in the tuner, until any one of the broadcasting stations is selected as a result of tuning in the tuner, when a tuning output is obtained in a form of an intermediate frequency signal from the intermediate frequency amplifier, which is used to stop discharging or charging of the potential memory device, with the result that the frequency of a given transmitting station is automatically selected. A further detailed description of the automatic tuning apparatus shown is given in the following with particular reference to the lower half portion of the FIG. 1 diagram.

Referring again to FIG. 1, the automatic tuning apparatus comprises a manually operable switch 111 for starting the scanning of the broadcasting frequency band, which comprises an upward scanning switch, which is energized by a +B voltage source and is connected to a set input of a flip-flop 111F. A reset input to the flip-flop 111F is connected from an output of an AND gate 141. One input of the AND gate 141 is supplied with an output of a level detector 125 which level detects the ratio detected audio signal outputted from the ratio detector 124, while the other input of the AND gate 141 is supplied with an output from an amplitude level detector 142, which level detects the amplitude of the intermediate frequency signal from the amplifier 123. A charging/discharging control circuit 119 is provided to control charging or discharging of a potential memory device MD of a potential memory device circuit 113 as a function of an output from the switch 111 and a disabling signal associated with an output from the intermediate frequency amplifier 123, as to be described hereinafter. An output of the potential memory device circuit 113 is supplied to a DC amplifier 114. An output from the amplifier 114 is fed to the tuner 121 as the scanning control voltage. In the tuner 121, an output from the DC amplifier 114 is fed to the voltage controlled variable capacitor VC in the reverse direction, as well known in those skilled in the art. An output from the amplifier 114 is also fed to an upper threshold detector 115 and a lower threshold detector 116, so that either of the outputs from the detectors 115 and 116 in response to a predetermined upper threshold or lower threshold of the output from the amplifier 114 sets or resets a flip-flop 117, respectively. The reset output of the flip-flop 117 is connected through a discharge mode control circuit 112D to the charging/discharging control circuit 119, so that the circuit 119 is caused to effect the discharging operation mode, while the set output of the flip-flop 117 is connected through an instantaneous charge mode control circuit 112C to the charging/discharging control circuit 119, so that the circuit 119 is caused to effect the instantaneous charging operation mode.

The potential memory device MD may be the same as the FIG. 6 embodiment disclosed in the patent referenced previously. More specifically, the potential memory device MD comprises a main cathode MC and an auxiliary cathode AC of Ag, an anode A of an Ag-Te alloy, and a solid state electrolyte having high ion conductivity, such as $RbAg_4I_5$ sandwiched between the cathodes MC and AC and anode A. The main cathode MC is connected to an output of the charging/discharging control circuit 119 for the purpose of charging or discharging of the memory device MD, and the auxiliary cathode AC is connected to the input of the DC amplifier 114 for the purpose of amplifying the terminal voltage of the memory device MD, while the anode A is connected to an anode of a battery B a cathode of which is grounded. Thus, it is seen that the potential memory device MD and the battery B are connected in series in an opposite polarity. When a DC voltage is applied to the device MD so that the main cathode MC may be negative, a charging current flows from the anode A to the cathodes MC and AC and a portion of Ag contained in the anode A migrates over to the cathodes, resulting in an increased terminal voltage of the potential memory device MD per se and thus a decreased output voltage from the circuit 113 because of the above described opposite polarity connection. This operation is referred to as charging in the present specification. On the other hand, when a DC voltage is applied to the device MD in the reverse direction as compared with the former case, Ag is refilled into the anode A, resulting in the decreased terminal voltage of the potential memory device MD per se and thus an increased output voltage from the circuit 113 because of the above described opposite polarity connection. This operation is referred to as discharging in the present specification.

The operation of the FIG. 1 embodiment will be better understood by the following description. For the purpose of describing the operation of the embodiment shown, first let it be assumed that the scanning switch 111 is manually operated. Further let it be assumed that no radio broadcasting signal has been broadcast in the frequency band and the flip-flop 117 has been reset so that the circuit 119 is caused to be in the discharging mode. When the scanning switch 111 is manually operated, the flip-flop 111F is set and the charging/discharging control circuit 119 is enabled and thus the potential memory device MD is discharged as specifically defined in the present specification in a normal speed, whereby the terminal voltage of the device MD is gradually decreased and thus the output voltage from the circuit 113 is gradually increased, which is amplified by the DC amplifier 114.

The increasing output voltage from the DC amplifier is applied to the variable capacitance diode VC in the tuner 121, which causes a decrease in capacitance across the diode VC and thus a scanning operation by the tuner 121 toward a higher frequency. If the device MD had been caused to continue further the discharging mode, then the device MD would have been destroyed because of over-discharging. However, in the embodiment shown, an output from the DC amplifier 114, which corresponds to the upper threshold voltage of the device MD but has been amplified by the amplifier 114, is threshold detected by the upper threshold detector 115 to cause the flip-flop 117 to be set. Therefore, no reset output from the flip-flop 117 is applied to the discharge mode control circuit 112C, while a set output from the flip-flop 117 is applied to the instantaneous charge mode control circuit 112C, so that the control circuit 112 is caused to be in an instantaneous charge mode, and thus the potential memory device MD is instantaneously charged, as specifically defined in the present specification. In the embodiment shown, the output from the DC amplifier 114 which corresponds to the lower threshold voltage of the output from the circuit 113 reached as a result of the instantaneous charging of the device MD but has been amplified by the amplifier 114, is threshold detected by the lower threshold detector 116 to cause the flip-flop 117 to be reset. The reset output from the flip-flop 117 is applied thereafter to the discharge mode control circuit 112C so that the control circuit 112 is caused to be in the normal discharging mode again. Thereafter the same operation is repeated as mentioned above.

It is understood from the foregoing description that in a time period of the normal discharging mode a reset output is provided from the flip-flop 117 to enable the control circuit 112D and in a time period of the instantaneous charge mode a set output is provided from the flip-flop 117 to enable the control circuit 112C. In the discharging and charging mode period of time an output from the DC amplifier 114 is applied to the tuner 121.

As described previously, in the tuner 121, the said output is applied as a scanning control voltage to voltage controlled variable capacitors connected associated with the tuning circuit for a high frequency amplifier and a local oscillator. Therefore, it is understood that it is necessary to choose a range of change in voltage of the memory device such that the said range suffices to cover voltage values which are required all the broadcasting frequencies by the use of the tuner 121 employing the said voltage controlled variable capacitor so as to be supplied with the said voltage values.

Now let it be assumed that scme radio broadcasting stations are broadcasting using different frequencies in a certain area. Further let it be assumed that the potential memory device MD has been charged to an initial point. When the scanning switch 111 is manually operated, the flip-flop 111F is set and the automatic tuning apparatus is caused to be in the normal discharging mode, or the upward scanning mode. When the output voltage of the potential memory device circuit 113 comes to correspond to a frequency of carrier wave in which a radio signal has been broadcast, the tuner 121 automatically makes tuning to the frequency and selects the transmitting station, so that an intermediate frequency output is provided at the intermediate frequency amplifier 123 and an output is provided from the amplitude level detection circuit 142. Just when the tuner 121 makes precise tuning to the frequency, an output is also provided from the ratio detector 124 and thus the level detection circuit 125. Therefore, the input condition of the gate 141 is met and an output is obtained from the gate 141. The output from the AND gate 141 resets the flip-flop 111F and thus disables the charging/discharging control circuit 119 so that the normal discharging mode is discontinued thereafter. Such a state as thus established is kept unchanged and thus the voltage of the memory device circuit 113 remains the same until a further manual operation is made of the switch 111. Upon such a manual operation of the switch 111, the charging/discharging control circuit 119 is again forced in an enabled condition of the normal discharging mode, so that the radio frequency band is scanned in the abovementioned manner from the lower frequency to the higher frequency, until another frequency now in broadcasting is selected by the tuner 121. When the voltage to be supplied to the tuner comes to be the upper threshold value, the state of the flip-flop 117 is changed so that the charging/discharging control circuit 119 is controlled to be in the instantaneous charge mode. This makes the further tuning to be effected again from the lower frequency to the higher frequency upon manual operation of the switch 11.

As described previously, the level detection circuit 125 serves to level detect the ratio detected audio signal outputted from the ratio detector 124, which is also utilized as an automatic frequency control signal. The automatic frequency control signal obtainable from the level detection circuit 125 is applied to an automatic frequency control charging/discharging circuit 128 to enable it. An output from the automatic frequency control charging/discharging circuit 128 is applied to the potential memory device circuit 113. More specifically, the automatic frequency control charging/discharging circuit 128 is enabled by the output from the level detection circuit 125 to control the charging or discharging of the potential memory device MD to fine adjust the output voltage from the potential memory device circuit 113, whereby an automatic frequency control is achieved.

It is understood to those skilled in the art that the control voltage which is applied to the voltage controlled variable capacitance diode VC of the tuner 121 from the amplifier 114 and a frequency which the tuner 121 selects in response to the control voltage are in close relationship with each other. The FIG. 1 embodiment further comprises an indicator 118 for indicating the selected frequency by the use of the output from the amplifier 114. The indicator 118 comprises a plurality of light emitting diodes A, B, C. . . F arranged in a line, each illuminating the corresponding frequency indicating region out of a plurality of divided frequency indicating regions of the frequency band to be received by the receiver, said regions being arranged in succession to cover said frequency band, and a corresponding plurality of drivers (not shown) responsive to said control voltage for energizing the corresponding light emitting diode for illuminating the corresponding frequency region to which the tuned frequency pertains.

The whole apparatus shown in FIG. 1 is energized by a power source PS through a powder switch PSW, which are shown in left lower portion in FIG. 1, together with an indication "TO THE WHOLE APPARATUS".

In the foregoing description, the FIG. 1 diagram has been described as embodied in an FM radio receiver. However, it is pointed out that the description given hereinabove can be applied to television receivers, and any other type of receivers under proper modifications which are obvious to those skilled in the art.

Figure 2:
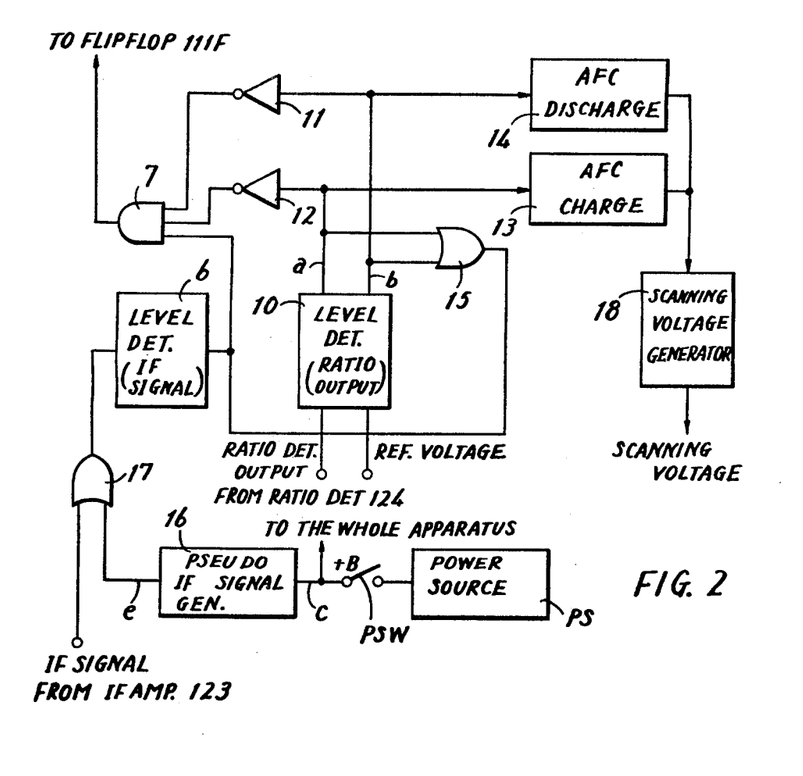
FIG. 2 is a block diagram of a major portion of the present invention to be embodied in the FIG. 1 apparatus.

FIG. 2 is a block diagram of only the major portion of the present invention to be embodied in the FIG. 1 apparatus. The present invention is characterized by provision of a pseudo intermediate frequency signal generating circuit 16, which receives the +B voltage source potential as an input thereto via the power switch PSW from the power source PS for energization of the whole apparatus and an output therefrom is applied to one input of an OR gate 17. The other input of the OR gate 17 is connected to receive the intermediate frequency signal from the intermediate frequency amplifying circuit 123 in FIG. 1. The output from the OR gate 17 is applied to an intermediate frequency signal level detection circuit 6 which corresponds to the level detection circuit 142 in FIG. 1. The output from the level detection circuit 6 is applied to one input to an AND gate 7 which corresponds to the AND gate 141 in FIG. 1. A level detection circuit 10, which corresponds to the level detection circuit 125 in FIG. 1, receives as inputs thereto the output voltage from the ratio detection circuit 124 in FIG. 1 and a reference voltage (a voltage approximately equal to the ratio detected output voltage when the tuning is completed) obtainable from the voltage source (not shown) and the outputs a and b of the level detection circuit 10 are applied to inverters 12 and 11, respectively, while both outputs are connected to an OR gate 15. The outputs from the inverters 11 and 12 are applied to the remaining two inputs of the AND gate 7. The output from the AND gate 7 is applied by way of the scanning stop signal to the reset input of the flip-flop 111F in FIG. 1. The output from the OR gate 15 is connected such that the low level output from the level detection circuit 6 forcibly brings in the low level the outputs a and b from the level detection circuit 10 and thus disables the automatic frequency control, as to be more fully described subsequently. The outputs a and b from the level detection circuit 10 are also applied to the automatic frequency control charging circuit 13 and an automatic frequency control discharging circuit 14, respectively. The automatic frequency control charging circuit 13 and the automatic frequency control discharging circuit 14 correspond to the automatic frequency control circuit 128 in FIG. 1 and the outputs from these circuits 13 and 14 are applied to the scanning voltage generating circuit 18 which correspond to the potential memory device circuit 113. Accordingly, the scanning voltage generating circuit 18 provides a scanning voltage to be applied to the tuner 121.

Figure 3:
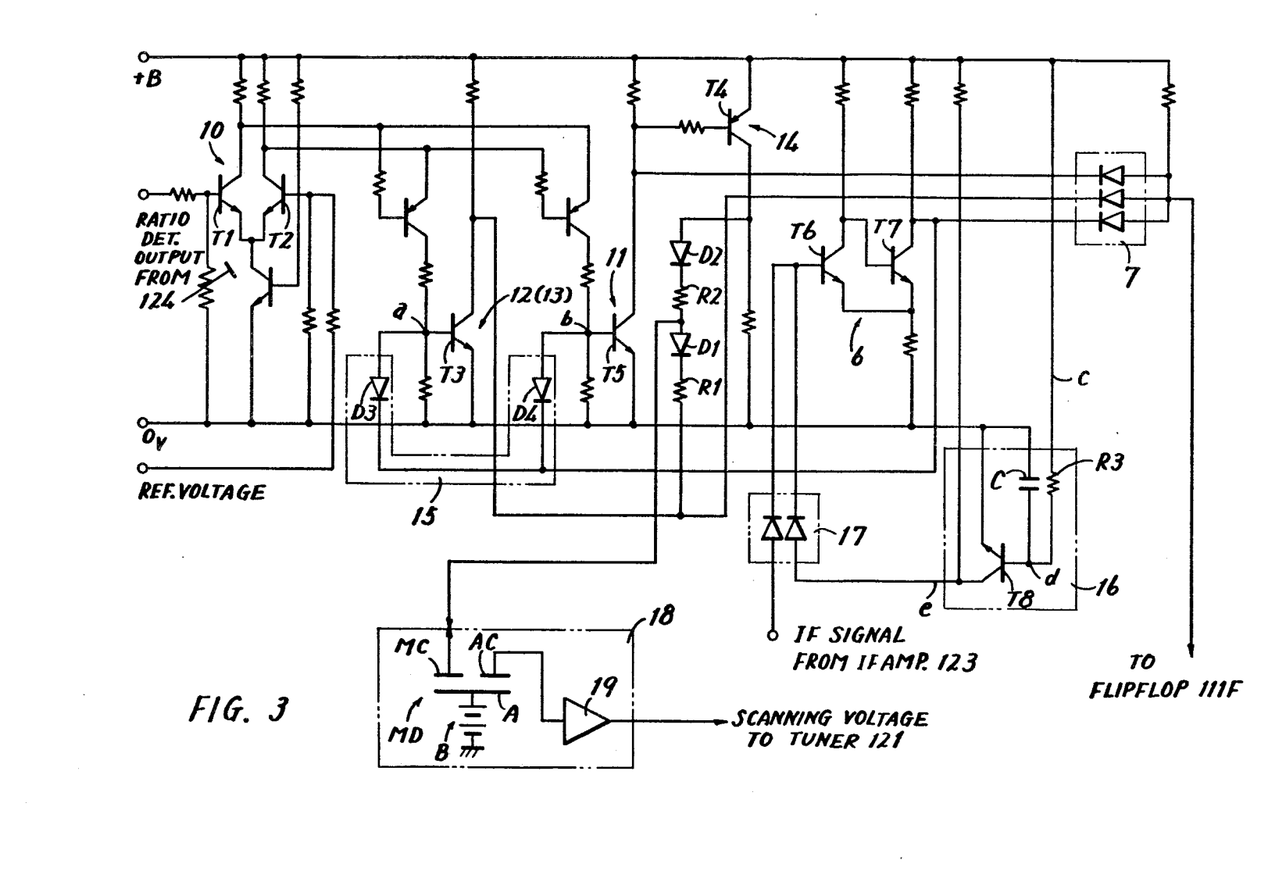
FIG. 3 is a schematic diagram of the FIG. 2 embodiment.

FIG. 3 illustrates a more detailed schematic diagram of the FIG. 2 embodiment. The level detection circuit 10 comprises a differential amplifier implemented by transistors T1 and T2 and another transistor for making constant the sum of the emitter currents of these two transistors T1 and T2. The ratio detected output voltage from the ratio detection circuit 124 is applied to the base of one transistor T1 and the reference voltage is applied to the base of the other transistor T2. Accordingly, if and when both input levels of these transistors become equal, i.e. the tuning is completed, no outputs are obtained at the collector of these transistors T1 and T2. In other words, if and when the tuner is tuned substantially, the difference between the reference voltage and the ratio detected output voltage becomes smaller than the predetermined value, and the outputs a and b from the circuit 10 become both the low level. On the contrary, if and when these two inputs become imbalanced to exceed the above described predetermined value, either the output a or b becomes the high level. These outputs a and b of the level detection circuit 10 are applied to the anodes of diodes D3 and D4, respectively, constituting the OR gate 15. The cathodes of the diodes D3 and D4 are commonly connected to form an output of the OR gate 15, which is connected to the collector of a transistor T7 constituting the level detection circuit 6, such that the low level output at the collector of the transistor T7 forcibly brings the bases of the transistors T3 and T5 to the low level to disable the automatic frequency control, as to be more fully described subsequently.

The inverter 12 comprises a transistor T3 and serves to invert the output a applied to the base thereof and provides the inverted output at the collector thereof. The collector of the transistor T3 is connected to the cathode of one diode of the AND gate 7. It is pointed out that the transistor T3 also constitutes the automatic frequency control charging circuit 13 to be described subsequently. The inverter 11 comprises a transistor T5 and serves to invert the output b applied to the base thereof and provide the inverted output at the collector thereof. The collector of the transistor T5 is connected to the cathode of one diode of the AND gate 7.

The automatic frequency control discharging circuit 14 comprises a transistor T4, the base of which is connected through a resistor to the collector of the transistor T5, the emitter of which is connected to the +B voltage source and the collector of which is, through a resistor, grounded (the zero volt potential). The collector of the transistor T4 is connected in series with a series circuit of the diode D2 and a resistor R2 and a series circuit of a diode D1 and a resistor R1, one end of the resistor R1 being connected to the collector of the transistor T3 constituting the automatic frequency control charging circuit 13. The junction between the resistor R2 and the anode of the diode D1 is connected to the main cathode MC of the potential memory device MD of the scanning voltage generating circuit 18. Accordingly, if and when the base potential of the transistor T3 becomes the high level, i.e. the output a of the level detection circuit 10 becomes the high level, the transistor T3 is turned on. Therefore, a charging current flows from the potential memory device MD through the diode D1, the resistor R1, the collector of the transistor T3, the emitter of the transistor T3 to the ground (the zero voltage potential), so that the output voltage from the auxiliary cathode of the potential memory device becomes lower. When the base potential of the transistor T4 becomes the low level, i.e. the output b of the level detection circuit 10 becomes the high level, the transistor T4 is turned on. Therefore, a discharging current flows from the +B voltage supply through the emitter of the transistor T4, the collector of the transistor T4, the diode D2, and the resistor R2 to potential memory device MD, so that the output voltage from the auxiliary cathode AC of the potential memory device MD becomes higher. Thus, the automatic frequency control charging circuit 13 and the automatic frequency control discharging circuit 14 control the charging or discharging of the potential memory device MD, and the output voltage from the device MD is amplified by the direct current amplifier 19 to provide the scanning voltage, which is applied to a variable capacitance diode VC in the tuner 121 of FIG. 1.

The AND gate 7 comprises three diodes, as described previously, the anodes of which are commonly connected to form an output terminal for providing the scanning stop signal, which is applied to the reset input of the flip-flop 111F in FIG. 1.

Figure 4:
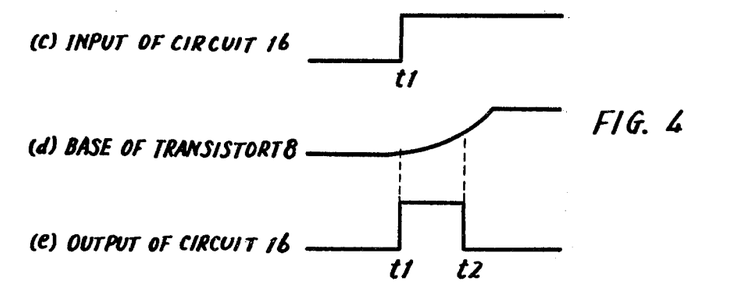
FIG. 4 is a graph showing waveforms at various portions in the pseudo intermediate frequency signal generating circuit.

The pseudo intermediate frequency signal generating circuit 16 comprises a transistor T8, a capacitor C, and a resistor R3. More specifically, one end of the resistor R3 is connected to the +B voltage source to receive the input signal c and the other end thereof is connected to one end of the capacitor C and to the base of the transistor T8. The other end of the capacitor C and the emitter of the transistor T8 are both grounded. The collector of the transistor T8 serves as an output terminal of the circuit 16 and provides the output e. More specifically, if the power switch PSW is turned on at the timing t1, the input c to the circuit 16 increases at the timing t1, as shown in FIG. 4(c), so that the capacitor C starts to be charged from the timing t1. Accordingly, one end of the capacitor C1, i.e. the base potential of the transistor T8 is gradually increased from the timing t1, as shown in FIG. 4 (d). The transistor T8 is turned on when the input level exceeds a predetermined level. Now assume that the base potential has reached the predetermined level at the timing t2. Accordingly, the transistor T8 is turned on at the timing t2. Therefore, the collector output thereof i.e. the output from the circuit 16 remains the high level from the timing t1 (turning on of the power switch PSW) to the timing t2 and thereafter the output turns to the low level.

The output e of the pseudo intermediate frequency signal generating circuit 16 is applied to the anode of one diode constituting the OR gate 17. The OR gate 17 comprises another diode, the anode of which is connected to receive the intermediate frequency signal from the intermediate frequency amplifying circuit 123. The cathodes of two diodes are commonly connected to form an output terminal, which is connected to the base of the transistor T6 to be described subsequently. The intermediate frequency signal level detection circuit 6 comprises Schmitt circuit implemented by transistors T6 and T7. The collector output of the transistor T7, i.e. the output from the circuit 6, as well as the cathode of one diode constituting the AND gate 7, is connected to the output from the OR gate 15. Now that the circuit configuration of the embodiment has been described with reference to FIGS. 1 to 4, the operation thereof will be described in the following.

In operation, the tuner 121 is scanned by the scanning voltage obtained from the scanning voltage generating circuit 18, and is tuned to a given broadcast wave. The output from the intermediate frequency signal level detection circuit 6 becomes the high level and both outputs a and b of the level detection circuit 10 for the ratio detected output become the low level. Accordingly, the outputs from the inverters 11 and 12 become the high level. Therefore, the output from the AND gate 7 becomes the high level so that the flip-flop 111F is reset, with the result that the scanning is stopped.

Now consider a situation in which after once the tuner is tuned to a given broadcast wave as a result of scanning and scanning is stopped to achieve the reception state, slight detuning occurs for some reasons. Then, the reference voltage and the ratio detected output voltage being inputted to the level detection circuit 10 become imbalanced. Accordingly, either output a or b of the level detection circuit 10 becomes the high level. Therefore, either the automatic frequency control charging circuit 13 or the automatic frequency control discharging circuit 14 is enabled and thus the scanning voltage generating circuit 18 is controlled to charge or discharge the potential memory device MD. As a result, the scanning voltage and thus the tuning frequency is fine adjusted, whereby the detuning is corrected.

Now, consider a situation in which although the tuning is completed by the tuner, the incoming broadcast wave is interrupted for some reasons (for example, an automobile bearing a radio receiver employing the inventive automatic tuning apparatus passes through a tunnel). Since the broadcast wave is interrupted in such a situation, the ratio detected output voltage becomes indefinite with respect to the reference voltage. Therefore, it could happen either output a or b of the level detection circuit 10 becomes the high level, and accordingly the automatic frequency control charging circuit 13 or the automatic frequency control discharging circuit 14 is enabled, whereby the automatic frequency control operates in the reverse direction (detuning direction), with the result that increased detuning occurs. In order to prevent such an inconvenience, the apparatus is preferably structured such that the automatic frequency control charging circuit 13 and the automatic frequency control discharging circuit 14 are enabled only when the broadcast wave is received and the intermediate frequency signal is obtained, thereby to make correction of deviation of tuning. The OR gate 15 serves to disable the automatic frequency control charging circuit 13 or the automatic frequency control discharging circuit 14 by forcibly bringing the output a or b of the high level from the level detection circuit 10 to the low level, when the intermediate frequency signal is smaller than the predetermined level.

Figure 5:
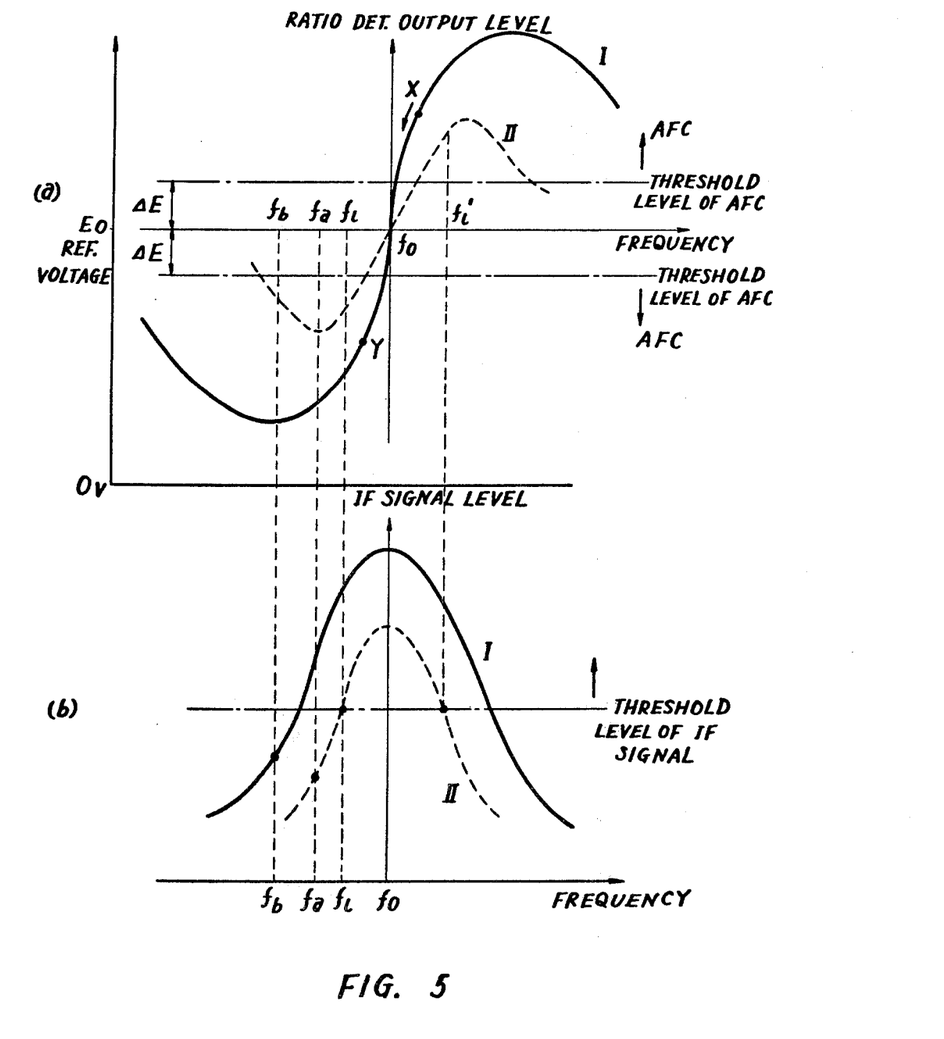
FIG. 5 is a graph showing a characteristic of the ratio detected output of the intermediate frequency signal versus the frequency deviation and a characteristic of the magnitude of the intermediate frequency signal versus the frequency deviation.

FIG. 5 is a graph showing a characteristic of the ratio detected output of the intermediate frequency signal versus the frequency deviation and a characteristic of the magnitude of the intermediate frequency signal versus the frequency deviation. Detailed description will be made of the operation with reference to FIG. 5. First consider a situation where the tuner of the receiver is tuned to a certain broadcast wave in the course of the scanning. Then, the difference between the ratio detected output voltage and the reference voltage EO being inputted to the level detection circuit 10 becomes smaller than the predetermined value $\Delta E$. Therefore, the currents flowing through the transistors T1 and T2 constituting the differential amplifier become equal, so that both outputs a and b of the transistors T1 and T2 becomes the low level. Therefore, the transistor T3 of the automatic frequency control charging circuit 13 and the transistor T4 of the automatic frequency control discharging circuit 14 are both kept turned off. Both the transistor T5 constituting the inverter 11 and the transistor T3 constituting the inverter 12 (which also constitute the automatic frequency control charging circuit 13) are turned off, and accordingly the collector output becomes the high level. Since the intermediate frequency signal exceeds the predetermined level, the transistor T6 of the level detection circuit 6 is turned on and the transistor T7 thereof is turned off. Therefore, the collector output of the transistor T7 becomes the high level. Accordingly, three diodes constituting the AND gate 7 are biased in the reverse direction so that the anode output becomes the high level. Accordingly, the flip-flop 111F is reset to stop the scanning, thereby to continue the reception state or the tuning state.

Now, assume that the tuning frequency is deviated toward a higher frequency for some reason so that the ratio detected output is shifted to the point X. Then, the ratio detected output voltage becomes higher to exceed the predetermined difference ΔE. Accordingly, a current flowing through the transistor T1 of the level detection circuit 10 increases, and accordingly the transistor T3 of the automatic frequency control charging circuit 13 becomes conductive. Therefore, a charging current flows from the main cathode of the potential memory device MD of the scanning voltage generating circuit 18 through the diode D1, the resistor R1 and the transistor T3 which has become conductive. Accordingly, the potential of the auxiliary cathode of the potential memory device MD decreases, and the output voltage (scanning voltage) from the amplifier 19 decreases. As a result, the tuner 121 of the receiver is scanned toward a lower frequency, to complete again the tuning, whereby the automatic frequency control operation is performed.

On the contrary, assume that the tuning frequency is deviated toward a lower frequency, whereby the ratio detected output has shifted to the point Y. Then, the ratio detected output voltage becomes lower away from the predetermined difference ΔE. Accordingly, the current flowing through a transistor T2 of the level detection circuit 10 increases and thus the transistor T4 of the automatic frequency control discharging circuit 14 becomes conductive. Therefore, a discharging current flows from the +B voltage source through the transistor T4 now being conductive, the diode D2 and the resistor R2 to the main cathode of the potential memory device MD of the scanning voltage generating circuit 18. Accordingly, the potential at the auxiliary cathode of the potential memory device MD increases, and thus the output voltage (the scanning voltage) from the amplifier 19 also increases. Therefore, the tuning frequency of the tuner 121 is scanned toward a higher frequency, whereby the tuning is completed again and thus the automatic frequency control operation is performed.

Now consider a case where although a given broadcast wave is tuned by the tuner the level of the intermediate frequency signal becomes smaller than the predetermined level (the threshold value in FIG. 5). Then, the transistor T6 of the level detection circuit 6 is turned off because of a change in potential applied through the diode of the OR gate 17. Therefore, the transistor T7 becomes conductive and the diodes D3 and D4 of the OR gate 15 comes to be biased in the forward direction. Accordingly, neither the transistor T3 of the automatic frequency control charging circuit 13 nor the transistor T4 of the automatic frequency control discharging circuit 14 is not turned on, even though the ratio detected output voltage has exceeded the predetermined difference ΔE. Thus, the automatic frequency control is not performed, as described previously.

If the inventive apparatus had been structured such that the automatic frequency control is disabled only if and when the level of the intermediate frequency signal does not exceed the predetermined value, i.e. the automatic frequency control is enabled only if and when the level of the intermediate frequency signal exceeds the predetermined value, the automatic frequency control operation would not have been performed at the time of turning on of the power switch, whereby the same broadcast wave received previously could not have been received again, in such situations as described in the following.

The first situation is a case where the condition of the broadcast wave being received is different between the time when the voltage source is turned off and the time when the voltage source is turned on again (for example, a case where the receiver is moved to a different place and is turned on again at the different place after the voltage source has been once turned off). More specifically, the ratio detected output characteristic before the voltage source is turned off is shown as the line I in FIG. 5(a) and the intermediate frequency signal characteristic is shown as the line I in FIG. 5(b), whereas the ratio detected output characteristic after the voltage source is turned on is shown as the line II in FIG. 5(a) and the intermediate frequency signal output characteristic after the voltage source is turned on again is shown as the line II in FIG. 5(b). Assuming that the tuning frequency is deviated to fa in FIG. 5, the automatic frequency control is preformed in case of the line I, whereby correction is made of the frequency. However, in case of the line II, the level of intermediate frequency signal becomes smaller than the predetermined value, and therefore the automatic frequency control is not performed, as described previously. This means that the same broadcast wave as received before the voltage source is turned off cannot be received when the voltage source is turned on again. More specifically, at the time of turning on again of the voltage source, the automatic frequency control operates only within the range of the frequencies fl–fl', and therefore the same broadcast wave as before cannot be received in such a situation.

The second situation is a case where a frequency variation occurs for some reasons, such as a difference in the ambient temperature between the time when the voltage source is turned off and the time when the voltage source is turned on again. Since the potential memory device has been utilized in the embodiment shown by way of the scanning voltage generating device, as described previously, the scanning voltage is kept constant even after the voltage source is turned off. Nevertheless, the tuning frequency could be varied because of variation in the ambient temperature as a matter of practice. In such a situation, assuming that the frequency is deviated to fb when the voltage source is turned on again, the intermediate frequency signal becomes smaller than the predetermined level, even if the characteristic had been as the line I, and therefore the automatic frequency control does not operate, as described previously. Accordingly, the broadcast wave received before cannot be received again when the voltage source is turned on again.

In order to solve the above described inconveniences, the present invention comprises the pseudo intermediate frequency signal generating circuit 16 and the OR gate 17, thereby to enable necessarily the automatic frequency control when the voltage source is turned on again.

More specifically, if and when the +B voltage source is turned on, by closing of the power switch PSW, the pseudo intermediate frequency signal of the high level as shown in FIG. 4(e) is obtained from the pseudo intermediate frequency signal generating circuit 16. Of course, it is important to select the voltage level (high level) of the pseudo intermediate frequency signal high enough to make conductive the transistor T6 of the level detection circuit 6. The pseudo intermediate frequency signal obtained when the voltage source is turned on remains the high level for a time period $t1-t2$ determined as a function of the charging time constant (determined by the capacitor C and the resistor R3) and is applied to the base of the transistor T6 through the diode of the OR gate 17. Therefore, the transistor T6 becomes conductive for the time period $t1-t2$ and accordingly the transistor T7 is turned off for the time period $t1-t2$. Therefore, neither output $a$ nor $b$ of the level detection circuit 10 for the ratio detected output is disabled, so that the automatic frequency control is operated irrespective of the level of the intermediate frequency signal. Thus, the same broadcast wave as received before can be received again even when the voltage source is turned on again.

When the tuning is completed after the lapse of the above described time period, the normal automatic frequency control starts to operate by the intermediate frequency signal of the intermediate frequency amplifying circuit 123 and the output of the ratio detection circuit 124.

In the embodiment described in the foregoing, the level of the intermediate frequency signal was employed which is nearly proportional to the field intensity of the broadcast wave, in order to make judgement whether the automatic frequency control is to be operated. Alternatively, however, another signal associated with the intensity of the broadcast wave received (the incoming signal level) may be used for making judgement whether the automatic frequency control is to be operated.

In short, the present invention comprises a provision for making judgement whether the automatic frequency control is to be operated by the use of a signal associated with the magnitude of the broadcast wave as received, such as the level of the intermediate frequency signal, so that the automatic frequency control does not improperly operate to cause the detuning even though the broadcast wave as received is interrupted for some reasons. The present invention further comprises a provision for enabling the automatic frequency control when the voltage source is turned on, so that any inconveniences in connection with the tuning frequency caused by turning off and on of the voltage source can be avoided.

Although this invention has been described and illustrated in detail, it is to be clearly understood that the same is by way of illustration and example only and is not to be taken by way of limitation, the spirit and scope of this invention being limited only by the terms of the appended claims.

What is claimed is:
1. An automatic tuning apparatus comprising:
   tuning means comprising a voltage controlled variable reactance device,
   means for supplying a control voltage to said voltage controlled variable reactance device, said control voltage determining a reactance value of said voltage controlled variable reactance device and thus determining a tuning frequency of said tuning means,
   means for changing said control voltage supplied from said control voltage supplying means to said voltage controlled variable reactance device for causing a change in reactance of said voltage controlled reactance device and thus a change in a tuning frequency of said tuning means,
   manually operable means for instructing said change in a tuning frequency of said tuning means,
   means for level detecting the amplitude of the output from said tuning means,
   means for providing a signal associated with the frequency of the output from said tuning means,
   means responsive to simultaneous outputs of said amplitude level detecting means and said frequency associated signal providing means for providing a logical product of said amplitude level detected signal and said frequency associated signal,
   means responsive to the instructing signal of said manually operable means and responsive to said logical product signal for enabling said means for changing said control voltage supplied from said control voltage supplying means,
   means responsive to said frequency associated signal of said frequency associated signal providing means for changing said control voltage supplied from said control voltage supplying means for compensating deviation of the tuning frequency,
   means responsive to absence of said amplitude level detected signal of said amplitude level detecting means for disabling said frequency compensating means, and
   means responsive to turning on of a power supply for providing for a predetermined period of time a pseudo amplitude level detected signal for forcibly enabling said frequency compensating means for said predetermined period of time.
2. An automatic tuning apparatus in accordance with claim 1, which further comprises
   power supply means for energization of said automatic tuning apparatus,
   a power switch for turning on or off of the power supply means to said automatic tuning apparatus, and
   means responsive to turning on of said power switch for providing an enabling signal for said predetermined period of time for enabling said frequency compensating means.
3. An automatic tuning apparatus in accordance with claim 2, in which said frequency associated signal providing means comprises
   means for frequency detecting the output from said tuning means, and
   means for level detecting the frequency detected output from said frequency detecting means.
4. An automatic tuning apparatus in accordance with claim 3, in which said frequency compensating means comprises means responsive to said frequency detected signal for changing said control voltage supplied from said control voltage supplying means for compensating deviation of the tuning frequency.

5. An automatic tuning apparatus in accordance with claim 2, in which
    said control voltage supplying means comprises
        means for storing a given quantity of electricity for providing an output voltage associated with said given quantity of electricity, and
    said frequency compensating means comprises
        means for charging/discharging said storing means.

6. Automatic tuning apparatus in accordance with claim 5, in which said pseudo signal providing means comprises
    means responsive to turning on of said power switch for timing said predetermined time period, and
    means responsive to said timing means for providing an enabling signal for enabling said frequency compensating means.

7. An automatic tuning apparatus in accordance with claim 6, in which said timing means comprises
    a capacitor connected to be charged with a given time constant by said power supply means, and
    means for level detecting the terminal voltage of said capacitor.

* * * * *